(12) United States Patent
Yamaguchi et al.

(10) Patent No.: US 11,569,089 B2
(45) Date of Patent: Jan. 31, 2023

(54) METHOD OF FORMING A SEMICONDUCTOR DEVICE, AND A PHOTOMASK USED THEREIN

(71) Applicant: MICRON TECHNOLOGY, INC., Boise, ID (US)

(72) Inventors: Hidenori Yamaguchi, Higashihiroshima (JP); Keizo Kawakita, Higashihiroshima (JP); Wataru Hoshino, Kure (JP); Shigeru Sugioka, Higashihiroshima (JP); Toshiyuki Maenosono, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 159 days.

(21) Appl. No.: 17/001,301

(22) Filed: Aug. 24, 2020

(65) Prior Publication Data

US 2022/0059346 A1    Feb. 24, 2022

(51) Int. Cl.
*H01L 21/027* (2006.01)
*H01L 21/311* (2006.01)
*H01L 27/108* (2006.01)

(52) U.S. Cl.
CPC .... *H01L 21/0274* (2013.01); *H01L 21/31144* (2013.01); *H01L 27/10847* (2013.01)

(58) Field of Classification Search
CPC .......... H01L 21/0274; H01L 21/31144; H01L 27/10847; H01L 21/311; H01L 21/78; G03F 1/32; G03F 1/58
USPC ......................................................... 438/703
See application file for complete search history.

(56) References Cited

U.S. PATENT DOCUMENTS

2021/0391279 A1 *   12/2021   Sugioka ................ H01L 23/585

* cited by examiner

*Primary Examiner* — Caleen O Sullivan
(74) *Attorney, Agent, or Firm* — Dorsey & Whitney LLP

(57) ABSTRACT

A method including forming an insulating film over first, second, third and fourth regions of a semiconductor substrate; forming a polyimide film on the insulating film; and patterning the polyimide film with a lithography method using a photomask including at least a first region of a first transmittance rate, a second region of a second transmittance rate, a third region having a shading material, and a fourth region, wherein the first, second, third and fourth regions of the photomask correspond to the first, second, third and fourth regions of the semiconductor substrate, respectively.

13 Claims, 16 Drawing Sheets

METHOD OF FORMING A SEMICONDUCTOR DEVICE, AND A PHOTOMASK USED THEREIN

BACKGROUND

For example, in a semiconductor device such as dynamic random-access memory (hereinafter referred to as DRAM), a low-k film having a low dielectric constant between metal interconnects is provided in some cases to reduce the capacitance between interconnects and achieve high-speed operation of the electric circuit. SiOC and SiCN for example are used as films with a low dielectric constant. In the following description, these films with a low dielectric constant are referred to as low-k films. Low-k films have lower adhesion than silicon oxide films and silicon nitride films, and the material is also brittle. For these reasons, when a semiconductor wafer on which semiconductor elements such as DRAM are formed is diced to separate the semiconductor elements into individual semiconductor chips, cracks produced by dicing sometimes propagate in the low-k film and the film interface (SiO2/SiOC, SiOC/SiCN, SiCN/SiO2) and reach the main circuit region of the semiconductor device, thereby reducing the yield of the semiconductor device.

BRIEF DESCRIPTION OF THE DRAWINGS

FIG. 3 is a longitudinal section illustrating one example of a schematic configuration in an exemplary process stage following FIG. 7. FIG. 3 illustrates a schematic longitudinal section of the portion along the line G-G in FIG. 2.

FIG. 9 is a longitudinal section illustrating one example of a schematic configuration in an exemplary process stage following FIG. 13. FIG. 9 illustrates a schematic longitudinal section of the portion along the line J-J in FIG. 8.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

A first embodiment will be described with reference to FIGS. 1 to 7. In the following description, DRAM is given as an example of the semiconductor device. Note that the dimensions and dimensional ratios of each unit in each of the drawings do not necessarily match the actual dimensions and dimensional ratios of the semiconductor device.

First Embodiment

Figure 1:
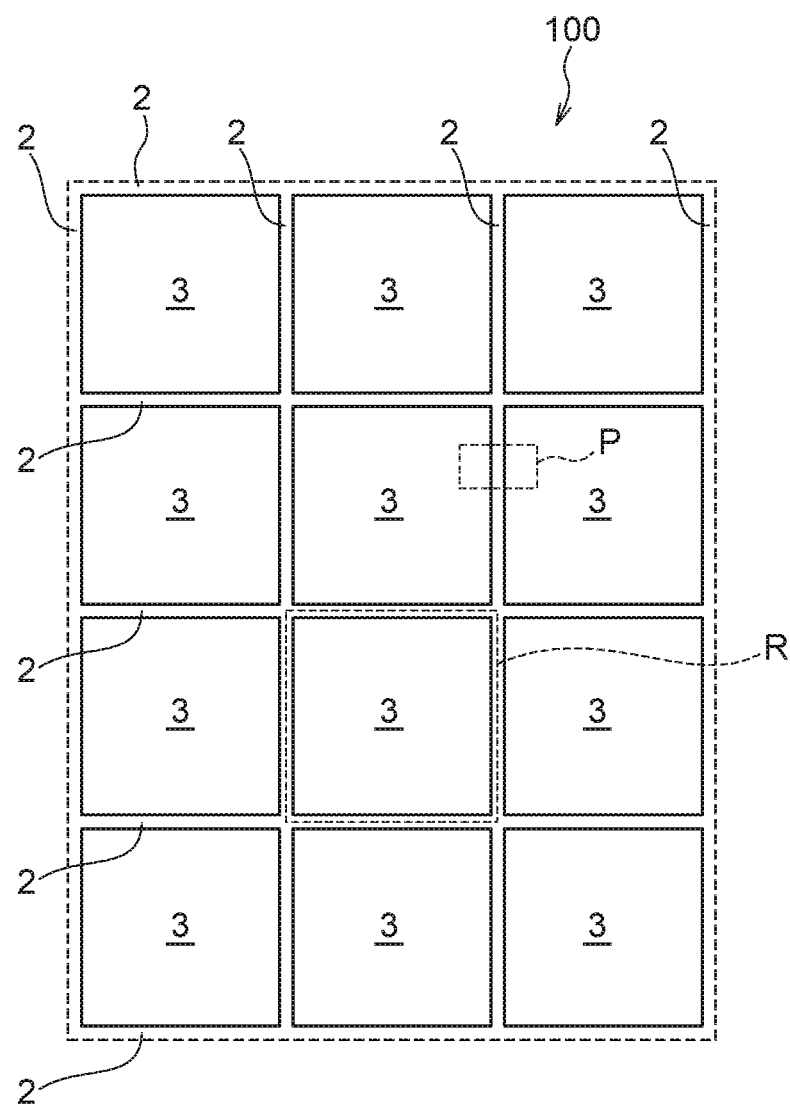
FIG. 1 is a plan view illustrating one example of a schematic configuration of the layout of a semiconductor wafer surface according to first and second embodiments.

FIG. 1 is a plan view illustrating a schematic configuration of a semiconductor wafer 100. The semiconductor wafer 100 is provided with a main surface on which various elements, insulating films, conductive films, and the like are formed. FIG. 1 illustrates the layout of a plurality of main circuit portions 3 and a scribe portion 2 included on the main surface of the semiconductor wafer 100.

Figure 1A:
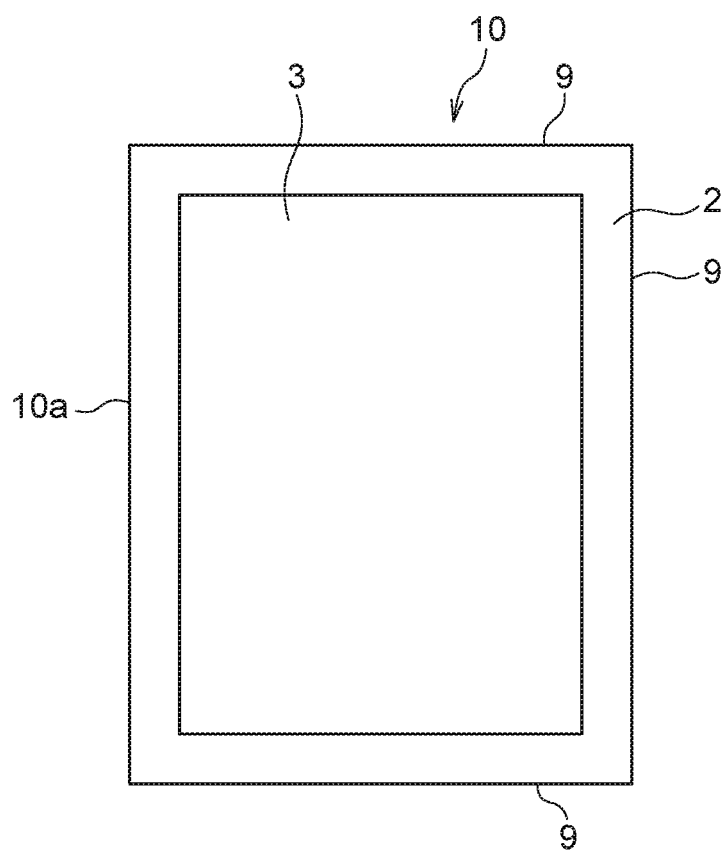
FIG. 1A is a plan view illustrating one example of a schematic configuration of a chip-shaped semiconductor device according to the first and second embodiments.

The semiconductor wafer 100 illustrated in FIG. 1 is schematically illustrated in the state before the semiconductor wafer is cut by a dicing step, or in other words, the state before the semiconductor wafer is separated into individual semiconductor chips. The main surface of the semiconductor wafer 100 includes the plurality of main circuit portions 3 in which circuit elements such as transistors or conductive interconnects forming DRAM are formed. Each main circuit portion 3 has a rectangular shape. The main circuit portions 3 are arranged in a matrix. The scribe portion 2 corresponds to a cutting region for separating the semiconductor wafer 100 into individual semiconductor chips 10 like the one illustrated in FIG. 1A. The cut portion 9 of the semiconductor wafer 100 is a chip edge 10a of each semiconductor chip 10. FIG. 1A is an enlarged view of the region R in FIG. 1. The scribe portion 2 is disposed around each of the main circuit portions 3. In each main circuit portion 3, components such as a plurality of memory cells, a data-related circuit that reads and writes memory cell data, and a control circuit that controls the data-related circuit are provided.

Figure 2:
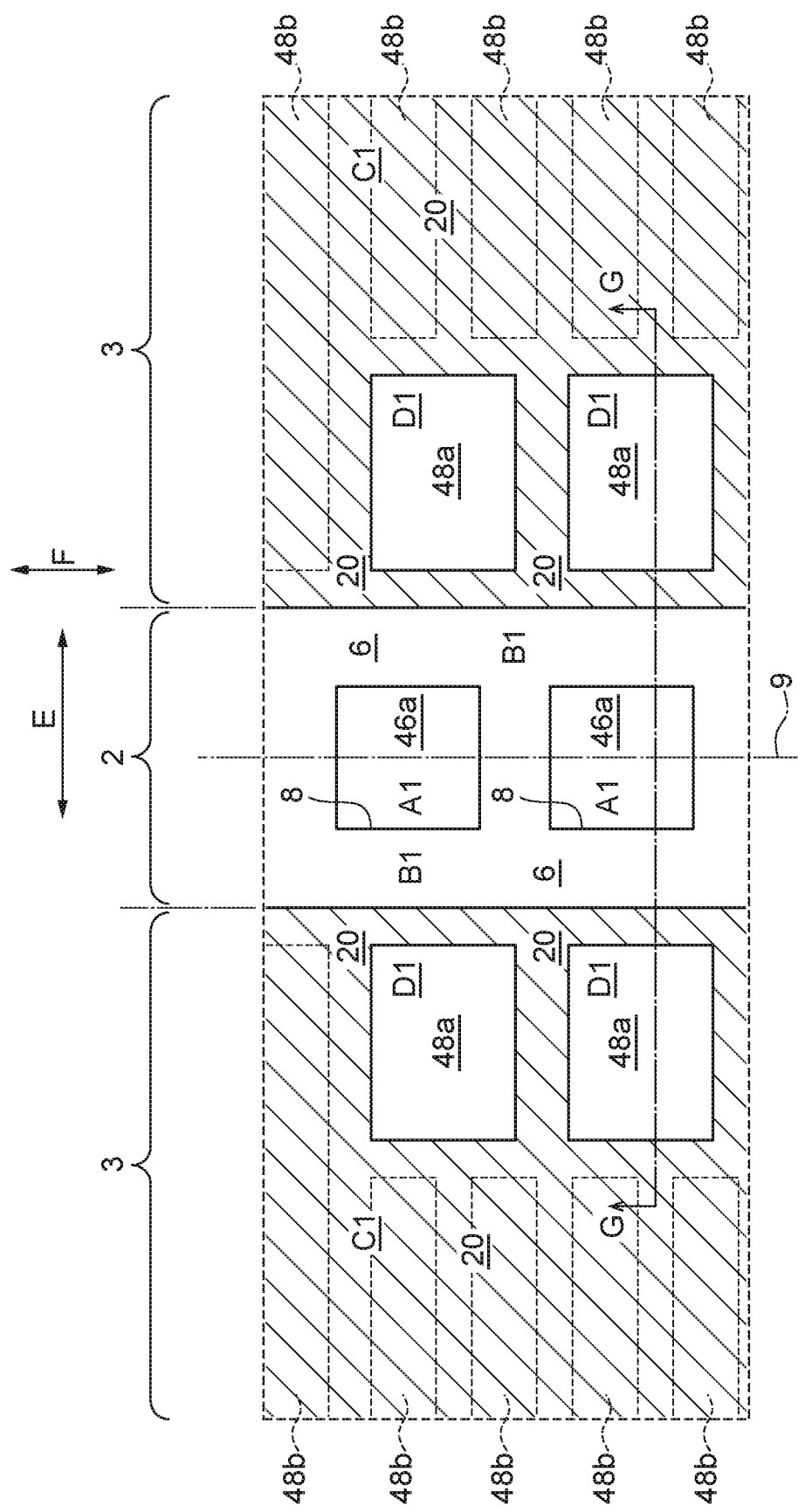
FIG. 2 is a plan view illustrating a schematic configuration of a part of the semiconductor device according to the first embodiment.
Figure 3:
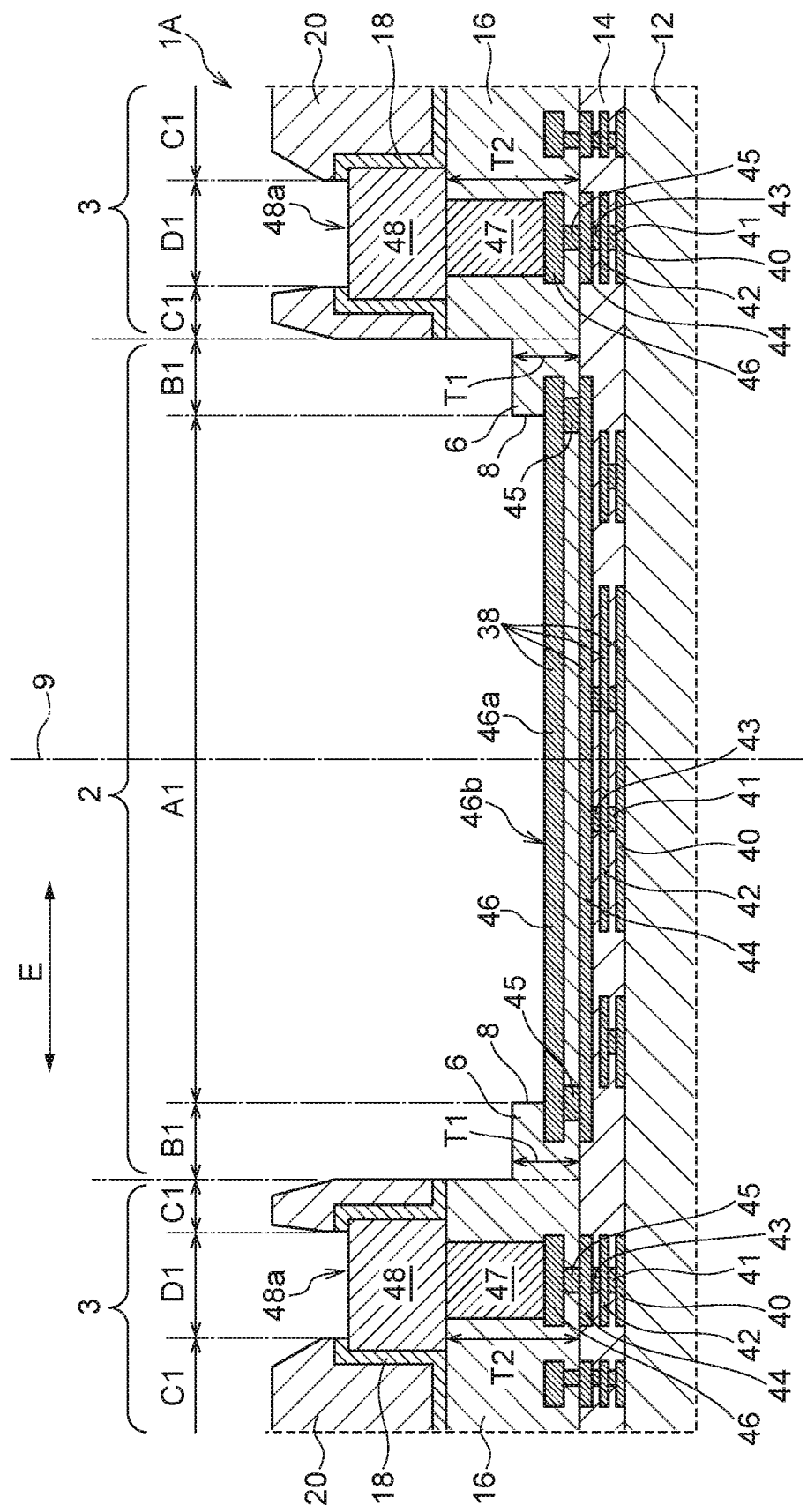
FIG. 3 is a diagram illustrating the semiconductor device and the method of manufacturing the same according to the first embodiment, and is a longitudinal section illustrating one example of the schematic configuration in a final process stage.

FIGS. 2 and 3 will be referenced to describe a schematic configuration of a semiconductor device 1A according to the first embodiment. FIG. 2 is an enlarged view of the region P in FIG. 1. FIG. 2 is a plan view illustrating one example of a schematic configuration of the scribe portion 2 and main circuit portions 3 adjacent to the scribe portion 2 exemplified in the first embodiment. In FIG. 2, the direction spanning the width of the scribe portion 2 is referred to as the width direction E. The scribe portion 2 is provided with a predetermined width defining the width direction E. The scribe portion 2 extends in a direction orthogonal to the width direction E. Also, the direction at a right angle to the width direction E is referred to as the direction F. FIG. 3 illustrates a schematic longitudinal section of the portion along the line G-G in FIG. 2.

As illustrated in FIGS. 2 and 3, the main circuit portions 3 are disposed on either side of the scribe portion 2 in the width direction E. The scribe portion 2 is sandwiched by the main circuit portions 3 on either side. The cut portion 9 is illustrated in a central part of the scribe portion 2. The cut portion 9 is formed in a later dicing step. The cut portion 9 is formed in the approximate center in the width direction E of the scribe portion 2.

As illustrated in FIGS. 2 and 3, metal pads 46a are disposed in the scribe portion 2. The scribe portion 2 is provided with test element groups (hereinafter referred to as TEGs) (not illustrated) for measuring properties such as the electrical characteristics of the manufactured semiconductor devices 1. The metal pads 46a are electrically connected to the TEGs to measure the electrical characteristics of the TEGs. During a measurement of a TEG, the electrical characteristics of the TEG are measured by causing a measuring probe connected to a measuring instrument to abut the metal pads 46a. The metal pads 46a contain a conductive material. The metal pads 46a contain a metal such as aluminum (Al), for example. The metal pads 46a may also contain a barrier metal above and below a metal electrode.

The metal pads 46a are formed by one of the wiring layers included in an intermediate wiring layer 38 described later. In the embodiment, the metal pads 46a are included in a fourth metal wiring layer 46, which is the uppermost wiring layer of the intermediate wiring layer 38. Underneath the metal pads 46a, a first metal wiring layer 40, a first connecting portion 41, a second metal wiring layer 42, a second connecting portion 43, a third metal wiring layer 44, and a third connecting portion 45 are provided from a semiconductor substrate 12 side.

As illustrated in FIG. 3, the semiconductor device 1A is provided with a semiconductor substrate 12 and a low-k film 14 provided on the semiconductor substrate 12. Additionally, the semiconductor device 1A is provided with a multilevel wiring layer illustrated below.

The semiconductor device 1A is provided with the first metal wiring layer 40, the second metal wiring layer 42, the third metal wiring layer 44, the first connecting portion 41 that connects the first metal wiring layer 40 and the second metal wiring layer 42, and the second connecting portion 43 that connects the second metal wiring layer 42 and the third metal wiring layer 44, each being provided so as to be surrounded by the low-k film 14 on the bottom and lateral faces thereof.

The first metal wiring layer 40, the second metal wiring layer 42, and the third metal wiring layer 44 are divided in the scribe portion 2 and the main circuit portions 3. Note that the semiconductor substrate 12 herein is described as including various elements and conductive interconnects forming DRAM provided on the semiconductor wafer, an insulating film covering these elements, and the like.

Additionally, on the low-k film 14, the semiconductor device 1A is provided with a fourth metal wiring layer 46, the third connecting portion 45 that connects the third metal wiring layer 44 and the fourth metal wiring layer 46, an uppermost interconnect 48, and a fourth connecting portion 47 that connects the fourth metal wiring layer 46 and the uppermost interconnect 48. The first metal wiring layer 40, the first connecting portion 41, the second metal wiring layer 42, the second connecting portion 43, the third metal wiring layer 44, the third connecting portion 45, and the fourth metal wiring layer 46 contain metal. The fourth connecting portion 47 and the uppermost interconnect 48 contain metal.

The uppermost interconnect 48 disposed in the main circuit portions 3 contains a conductive material formed in the same step as a redistribution layer, for example. A redistribution layer refers to an interconnect layer added to redistribute terminals in a case of configuring a package with solder bumps and flip chip connections, for example. The redistribution layer is normally disposed in the uppermost part of the semiconductor device 1. The redistribution layer needs low resistance values, and is therefore thick.

As illustrated in FIGS. 2 and 3, the low-k film 14 and an insulating film 6 are stacked onto the semiconductor substrate 12 in the scribe portion 2. Herein, a low-k film means a film having a lower dielectric constant (k) than a silicon oxide film used between Cu interconnects and a silicon nitride film that is deposited on the Cu interconnects to prevent Cu diffusion. The insulating film 6 is disposed in the scribe portion 2 and has a thickness T1.

The top position of the insulating film 6 exists at a higher position than a top face 46b of the metal pads 46a. A portion of the insulating film 6 covers a peripheral part of the metal pads 46a. The region where the insulating film 6 is provided is referred to as the first region B1. An opening 8 is formed on top of the metal pads 46a. The opening 8 is not covered by the insulating film 6, and the top face 46b of the metal pads 46a is exposed. The region where the opening 8 is formed is referred to as the fourth region A1.

In each main circuit portion 3, a first insulating film 16 that covers the low-k film 14 is provided. The third connecting portion 45, the fourth metal wiring layer 46, the fourth connecting portion 47, and the uppermost interconnect 48 are provided above the low-k film 14. The uppermost interconnect 48 is provided on the first insulating film 16. The top face of the first insulating film 16 is positioned on the bottom face of the uppermost interconnect 48. A second insulating film 18 and a polyimide film 20 are provided to cover the first insulating film 16 and the uppermost interconnect 48.

On top of the uppermost interconnect 48, an opening 48a is formed in the second insulating film 18 and the polyimide film 20. In the opening 48a, the top face of the uppermost interconnect 48 is exposed. The uppermost interconnect 48 is a bonding pad to which a bonding wire (not illustrated) is connected. The region where the opening 48a is provided is referred to as the second region D1. The region where the opening 48a is not provided in the polyimide film 20 in the main circuit portions 3 is referred to as the third region C1. Note that in FIG. 2, the redistribution layer 48b is a wiring layer included in the film of the same layer as the uppermost interconnect 48.

The first insulating film. 16 covers the main circuit portions 3. The first insulating film 16 has a thickness T2. The thickness T1 of the insulating film 6 in the scribe portion 2 is smaller than the thickness T2 of the first insulating film 16 in the main circuit portions 3.

In the main circuit portions 3, the uppermost interconnect 48, the insulating film 18 covering the first insulating film 16, and the polyimide film 20 covering the top face of the second insulating film 18 are provided. The insulating film 18 includes a silicon nitride film, for example. With respect to the uppermost interconnect 48, the first metal wiring layer 40, the second metal wiring layer 42, the third metal wiring layer 44, and the fourth metal wiring layer 46 are referred to as the intermediate wiring layer 38.

In the scribe portion 2, the metal pads 46a are included in the fourth metal wiring layer 46, which is the uppermost layer of the intermediate wiring layer 38. A step is formed between the insulating film 6 having the thickness T1 and the first insulating film 16 having the thickness T2.

In the first embodiment, the low-k film 14 contains a carbon-doped silicon oxide film (SiOC film) and a nitrogen-doped silicon carbide film (SiCN film) for example. The nitrogen-doped silicon carbide film is capable of preventing the diffusion of Cu. SiOC and SiCN are given as examples, and some other low-k material having a low dielectric constant can be used as the low-k film 14. Also, the low-k film 14 is not necessarily limited to the above configuration, and may also be a laminated film containing a plurality of low-k films.

Next, a method of forming the semiconductor device 1 according to the first embodiment will be described with reference to FIGS. 3 to 7. The following describes a case where a positive polyimide film 20 is used.

Figure 4:
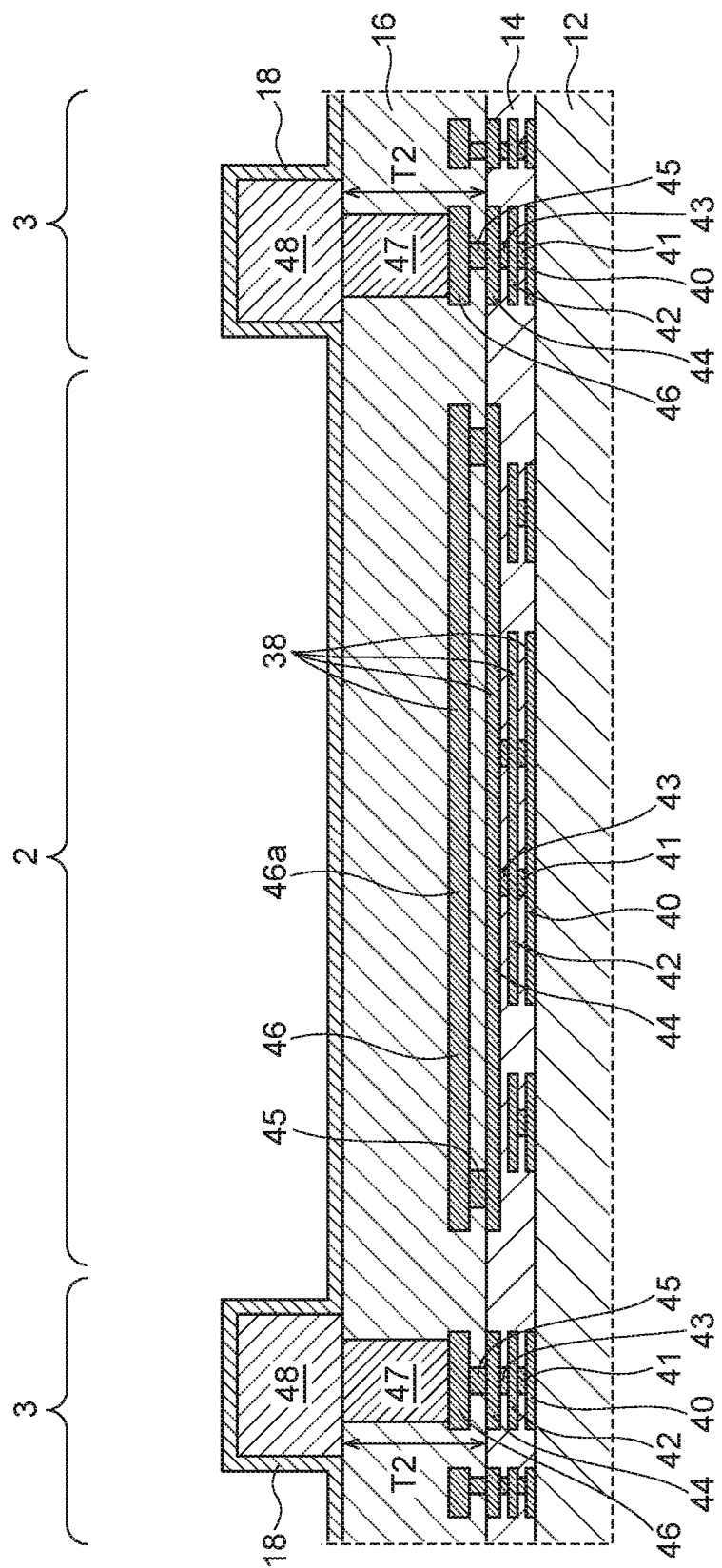
FIG. 4 is a diagram illustrating the semiconductor device and the method of manufacturing the same according to the first embodiment, and is a longitudinal section illustrating one example of the schematic configuration in an exemplary process stage.

First, as illustrated in FIG. 4, the first metal wiring layer 40, the first connecting portion 41, the second metal wiring layer 42, the second connecting portion 43, the third metal wiring layer 44, and the low-k film 14 covering these layers are formed above the semiconductor substrate 12 including the scribe portion 2 and the main circuit portions 3. The low-k film 14 contains at least one of SiOC and SiCN. The low-k film. 14 is formed by CVD, for example.

The top position of the third metal wiring layer 44 is level with the top position of the low-k film 14, and the top face of the third metal wiring layer 44 is not covered by the low-k film 14. As described above, the semiconductor substrate 12 includes various elements and conductive interconnects forming DRAM provided on a semiconductor wafer, as well as an insulating film covering these elements. Furthermore, the third connecting Portion 45 and the fourth metal wiring layer 46 are formed on top of the low-k film 14.

Next, the first insulating film 16 is formed. The first insulating film 16 is formed to cover the fourth metal wiring layer 46 in the scribe portion 2 and the main circuit portions 3. Furthermore, in the main circuit portions 3, holes reaching from the surface of the first insulating film 16 to the top face of the fourth metal wiring layer 46 are formed in the first insulating film 16.

Next, a conductive material such as a metal is buried in the holes to form the fourth connecting portion 47. Thereafter, the uppermost interconnect 48 is formed above the fourth connecting portion 47. Next, the second insulating film 18 is formed to cover the first insulating film 16 in the scribe portion 2, the first insulating film 16 in the main circuit portions 3, and the uppermost interconnect 48.

These metal wiring layers and insulating films are formed by chemical vapor deposition (hereinafter referred to as CVD), for example. The first insulating film 16 contains a silicon oxide (SiO2) film, for example. The second insulating film 18 contains a silicon nitride (SiN) film, for example. The first metal wiring layer 40, the first connecting portion 41, the second metal wiring layer 42, the second connecting portion 43, and the third metal wiring layer 44 contain copper (Cu), for example. The third connecting portion 45, the fourth metal wiring layer 46, the fourth connecting portion 47, and the uppermost interconnect 48 contain aluminum (Al), for example.

Figure 5:
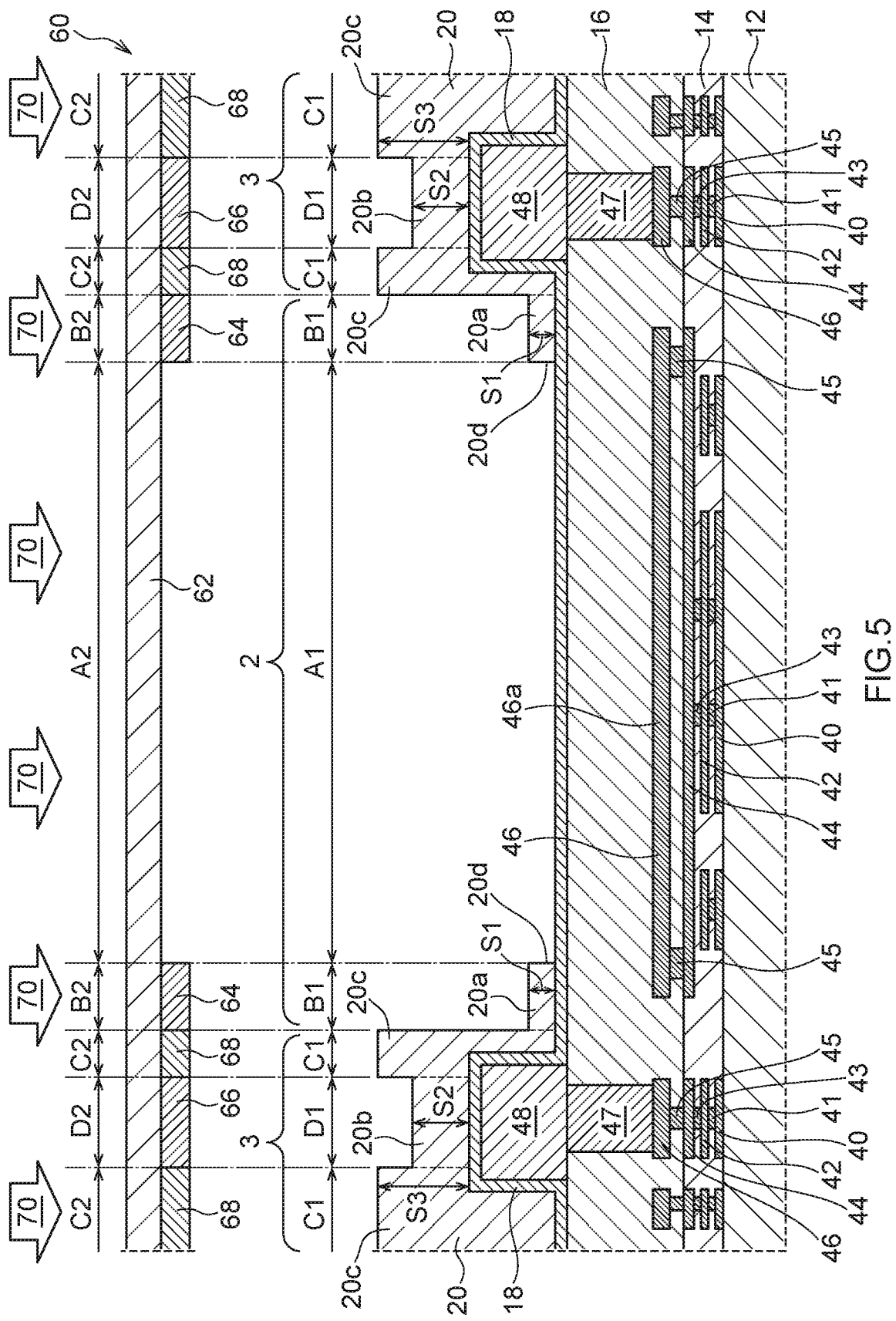
FIG. 5 is a diagram illustrating the semiconductor device and the method of manufacturing the same according to the first embodiment, is a longitudinal section illustrating one example of the schematic configuration in an exemplary process stage following FIG. 4, and is a longitudinal section illustrating a schematic configuration of a photomask according to an embodiment disposed in correspondence with the semiconductor device.
Figure 6:
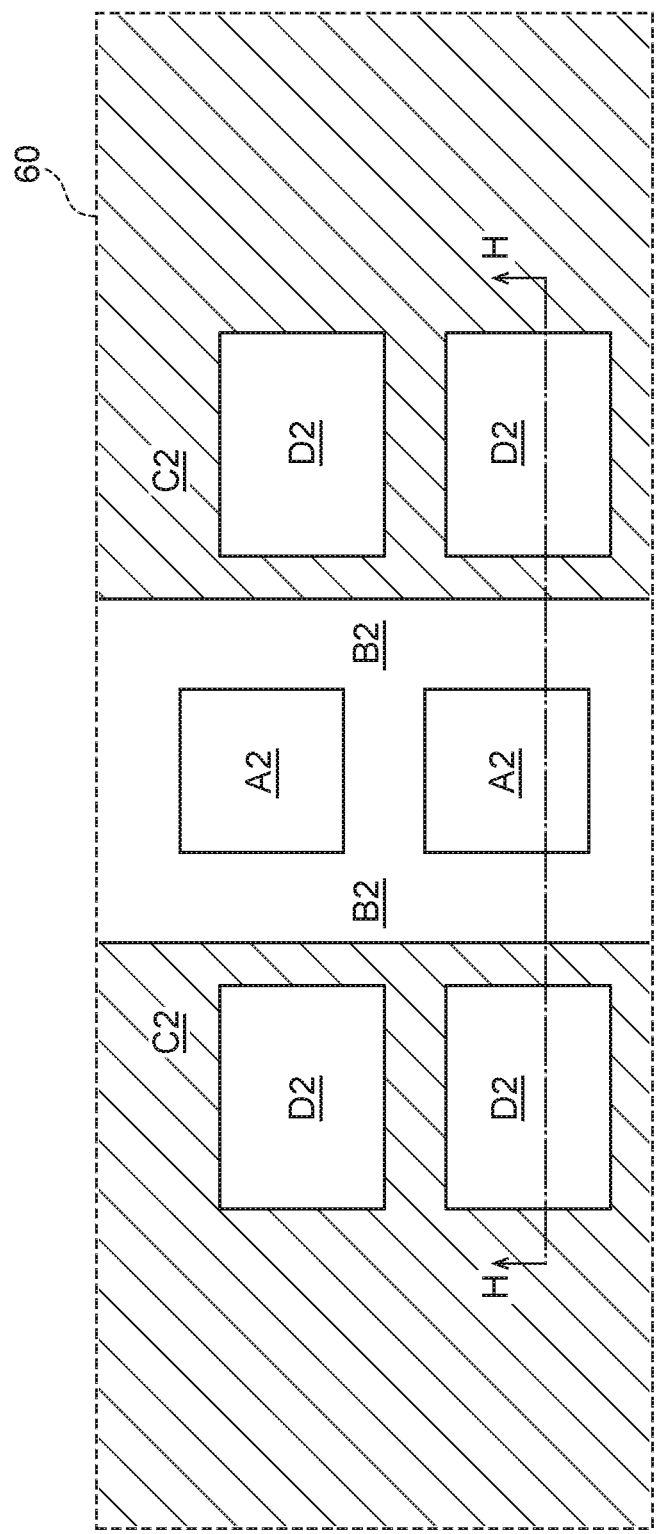
FIG. 6 is a plan layout view illustrating a schematic configuration of a part of the photomask according to the first embodiment.

FIGS. 5 and 6 are diagrams for describing a step of exposing and developing the polyimide film 20 in the embodiment. The exposure is performed using a lithographic apparatus (not illustrated). For the exposure light source, the 365 nm i-line is used, for example. The lithographic apparatus uses a 4× or a 5× reduction ratio. The exposure is performed using a photomask 60 on which a predetermined pattern is drawn as a photomask. Through the exposure, the pattern drawn on the photomask 60 is transferred to the semiconductor substrate 12. The arrows illustrated in FIG. schematically illustrate the irradiating light 70 that is provided from the lithographic apparatus (not illustrated).

FIG. 5 illustrates a longitudinal section of the polyimide film 20 patterned by exposure and development, and the photomask 60 used in the exposure of the polyimide film 20. FIG. 6 is a plan view illustrating a partial plan configuration of the photomask 60. The photomask 60 illustrated in FIG. 5 illustrates longitudinal section of the portion along the line H-H in FIG. 6. However, FIG. 5 schematically illustrates the positional relationship between the photomask 60 and the semiconductor substrate 12, and in the case of using a lithographic apparatus with a 4× reduction ratio, for example, the pattern of the photomask 60 is actually four times the size of the pattern that is transferred to the semiconductor substrate 12.

As illustrated in FIG. 5, by coating a polyimide and then performing exposure and development processes, the patterned polyimide film 20 is formed. The polyimide film 20 contains a photosensitive polyimide resin. In the first embodiment, the polyimide film 20 contains a positive photosensitive polyimide resin. In a positive photosensitive polyimide resin, the photosensitive polyimide in a region irradiated with light is removed by a development process performed after exposure. The photosensitive polyimide in a region not irradiated with light still remains after the development process. In the case where the exposure dose is insufficient to completely remove the photosensitive polyimide, the thickness of the polyimide film 20 is decreased.

The polyimide film 20 is formed as follows. In the semiconductor substrate 12 having the uppermost interconnect 48 and the like formed thereon, a polyimide liquid is dripped onto the semiconductor substrate 12 and spin-coated, and then soft-baked to evaporate unwanted solvent component.

Next, as illustrated in FIG. 5, the polyimide is patterned by performing exposure and development processes. The polyimide film 20 after exposure and development is provided with a polyimide part 20a having a thickness S1, a polyimide part 20b having a thickness S2, and a polyimide part 20c having a thickness S3. Here, the thicknesses S1, S2, and S3 exist in the following relationship.

$$S1<S2<S3$$

An opening 20d is provided in the patterned polyimide film 20. In the opening 20d, the second insulating film 18 is exposed. When the polyimide film 20 is irradiated with light of predetermined exposure value or greater in a lithography step, the applied polyimide film 20 is removed to form the opening 20d.

When the polyimide film 20 is irradiated with light of less than the predetermined exposure dose in the lithography step, a portion of the polyimide film 20 is removed, causing the thickness of the polyimide film 20 to decrease. With this arrangement, the polyimide film 20 having the polyimide part 20a with the thickness S1 or the polyimide part 20b with the thickness S2 is formed. In this case, the exposure dose for irradiating the polyimide part 20a is greater than the exposure dose for irradiating the polyimide part 20b. Consequently, the thickness S2 of the polyimide part. 20b is greater than the thickness S1 of the polyimide part 20a.

By controlling the exposure dose in this way, the thickness of the polyimide film 20 can be controlled. In the case where the polyimide film 20 is the positive type, reducing the exposure dose causes the thickness of the polyimide film 20 to increase. Furthermore, in the case where the polyimide film 20 is not irradiated with light, the thickness of the polyimide film 20 does not decrease, and the polyimide film 20 having the thickness S3 is obtained.

The thickness of the polyimide film 20 in the scribe portion 2 is treated as the thickness from the top face of the second insulating film 18 on the first insulating film 16. The thickness of the polyimide film 20 in the main circuit portions 3 is treated as the thickness from the top face of the second insulating film 18 on the uppermost interconnect 48.

Next, the structure of the photomask 60 used in the exposure step will be described with reference to FIGS. 5 and 6. As illustrated in FIGS. 5 and 6, the photomask 60 is provided with a first region B2, a second region D2, a third region C2, and fourth region A2. The fourth region A2 corresponds to the fourth region A1 on the semiconductor substrate 12. The first region B2 corresponds to the first region B1 on the semiconductor substrate 12. The third region C2 corresponds to the third region C1 on the semiconductor substrate 12. The second region D2 corresponds to the second region D1 on the semiconductor substrate 12.

The exposure dose used to expose the polyimide film 20 is controlled by the fourth region A2, the first region B2, the third region C2, and the second region D2 of the photomask 60. The first region B2, the second region D2, the third region C2, and the fourth region A2 each have different transmittances.

FIG. 5 illustrates the correspondence relationships between the regions A2, B2, C2, and D2 of the photomask 60 and the polyimide parts 20a, 20b, and 20c as well as the opening 20d formed on the semiconductor substrate 12. The sign 70 indicates the irradiating light from the light source. The light from the light source passes through the photomask 60. The polyimide film 20 on the semiconductor substrate 12 is irradiated by the transmitted light that has passed through each of the fourth region A2, the first region B2, the third region C2, and the second region D2.

The photomask 60 is provided with a transparent glass substrate 62, and a first transmissive structure 64, a second transmissive structure 66, and a light shading part 68 provided on one surface of the glass substrate 62. The glass substrate 62 contains a transparent material such as quartz glass, for example. The glass substrate 62 has a transmittance of substantially 100 percent. Light that passes through the glass substrate 62 is substantially not reduced at all or reduced only slightly. The first transmissive structure 64 and the second transmissive structure 66 are each provided with a predetermined transmittance, and may be formed as a first transmissive film and a second transmissive film that mask one surface of the glass substrate 62. Also, as illustrated in FIGS. 6A to 6F, the first transmissive structure 64 and the second transmissive structure 66 may be structures provided with a shading member and openings on one surface of the glass substrate 62.

None of the first transmissive structure 64, the second transmissive structure 66, and the light shading part 68 is disposed in the fourth region A2 of the photomask 60. In the fourth region A2, the glass substrate 62 is exposed. Irradiating light 70 irradiating the fourth region A2 passes through the photomask 60 substantially without being reduced and irradiates the polyimide film 20 in the fourth region A1 on the semiconductor substrate 12. The irradiating light 70 is set to have an exposure dose sufficient to remove the polyimide film 20. The polyimide film 20 in the fourth region A1 on the semiconductor substrate 12 is removed by the exposure and development processes. For this reason, the polyimide film 20 does not remain in the fourth region A1. The opening 20d is formed in the fourth region A1 on the semiconductor substrate 12.

The light shading part 68 is provided in the third region C2 of the photomask 60. In the third region C2, the irradiating light 70 is shaded by the light shading part 68. The light shading part 68 contains a light shading material such as chrome oxide, for example. The light shading part 68 has a transmittance of substantially 0 percent, and substantially does not allow light to pass through. Because the irradiating light 70 is shaded by the third region C2, the polyimide film 20 on the semiconductor substrate 12 is substantially not irradiated with light. Consequently, the polyimide film 20 on the semiconductor substrate 12 is formed without being reduced in thickness, and has the thickness S3.

The first transmissive structure 64 is provided in the first region B2 of the photomask 60. The second transmissive structure 66 is provided in the second region D2 of the photomask 60. The first transmissive structure 64 and the second transmissive structure 66 each have a light transmittance that is greater than percent and less than 100 percent. The first transmissive structure 64 and the second transmissive structure 66 contain a material such as molybdenum (Mo), chrome (Cr), silicon (Si), and their nitrides, for example. In the first embodiment, the transmittance of the first transmissive structure 64 is adjusted to be greater than the transmittance of the second transmissive structure 66.

The respective transmittances of the fourth region A2, the first region B2, the third region C2, and the second region D2 exist in the following relationship.

Transmittance of Transmittance of B2>Transmittance
of D2>Transmittance of C2

Also, after the exposure and development processes, the thicknesses S1, S2, and S3 of the polyimide parts 20a, 20b, and 20c in the fourth region A1, the first region B1, the third region C1, and the second region D1 on the semiconductor substrate 12 exist in the following relationship.

Thickness S1<Thickness S2<Thickness

Figure 6A:
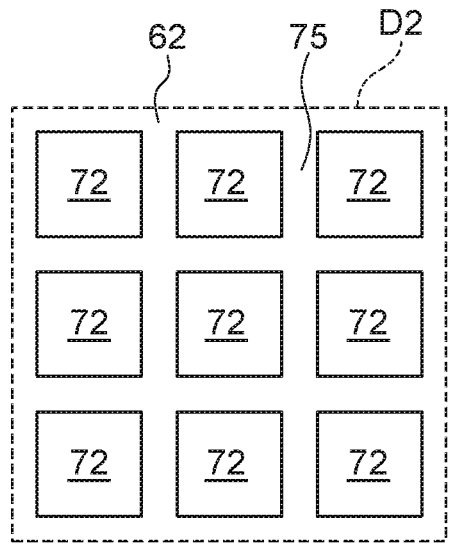
FIGS. 6A, 6B, 6C, 6D, 6E, and 6F are enlarged schematic plan views illustrating a part of the photomask.

Next, a detailed structure of the first region B2 and the second region D2 of the photomask 60 will be described. FIG. 6A is an enlarged plan view of the second region D2 of the photomask 60 illustrated in FIGS. 5 and 6. As illustrated in FIG. 6A, the second region D2 is provided with the glass substrate 62, rectangular light shading members 72, and an opening 75 that surrounds each of the rectangular light shading members 72. The light shading members 72 contain a shading material.

The light shading members 72 contain chrome oxide, for example. The light shading members 72 are provided on one face of the glass substrate 62. The light shading members 72 are not present in the opening 75, leaving the glass substrate 62 exposed. The light shading members 72 shade light, while the opening 75 allows light to pass through.

The second transmissive structure 66 provided with the light shading members 72 configured as above acts as the second region D2 that transmits a portion of the light from exposure. The light transmittance in the second region D2 can be controlled by adjusting the area ratio between the light shading members 72 and the opening 75. The area ratio between the light shading members 72 and the opening 75 is adjusted according to the size and the density of the light shading members 72.

The light transmittance in the second region D2 is adjusted according to the planned thickness of the polyimide film 20 after the development process and the exposure dose when exposing the polyimide film 20. The amount of decrease in the thickness of the polyimide film 20 can be controlled according to the exposure dose and the light transmittance of the light shading members 72. The exposure dose when exposing the polyimide film 20 is set such that the polyimide film 20 in the fourth region A1 on the semiconductor substrate 12 is completely removed.

Figure 6B:
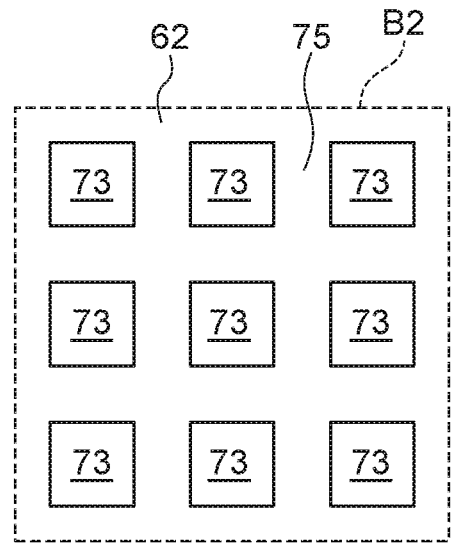

FIG. 6B is a plan view illustrating a detailed structure of the first region B2. In the first region B2, the photomask 60 is provided with light shading members 73 of smaller area than the light shading members 72 illustrated in FIG. 6A. The light shading members 73 contain a shading material. The rest of the configuration is the same as the configuration illustrated in FIG. 6A. In the first region B2, the area ratio between the light shading members 73 and the opening 75 is controlled by reducing the size of the light shading members 73 to less than the light shading members 72. With this arrangement, the light transmittance in the first region B2 is set to be higher than the light transmittance in the second region D2.

Figure 6C:
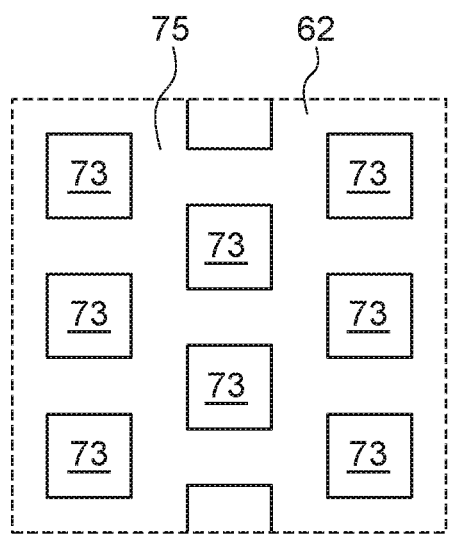
Figure 6D:
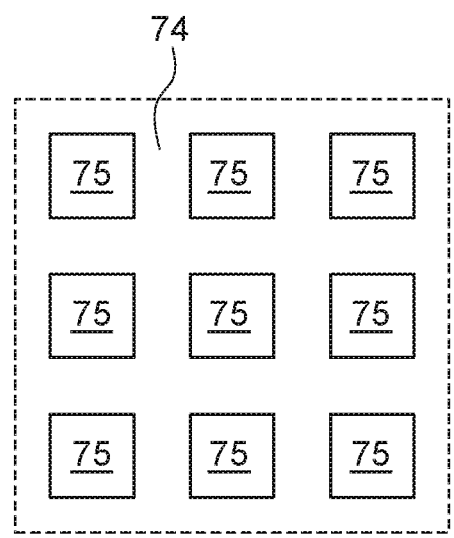
Figure 6E:
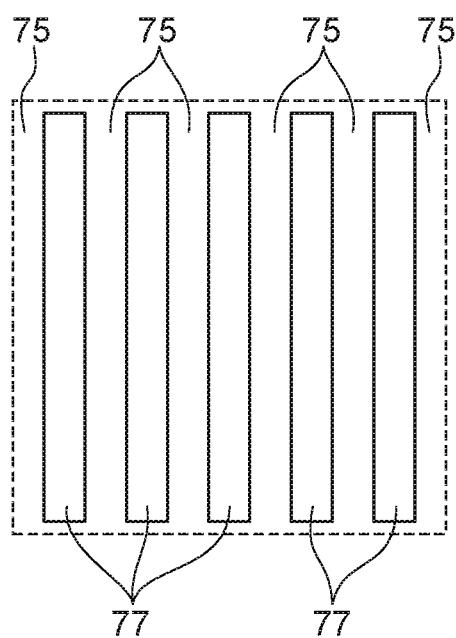

In FIG. 6C, the light shading members 73 are arranged in a staggered arrangement. Similarly, the light shading members 72 in the second region D2 may also be arranged in a staggered arrangement. FIG. 6D illustrates an inverse arrangement of a light shading member 74, which contains a shading material, and plurality of openings 75. Similarly, the light shading members 72 and the opening 75 in the second region D2 may also be inverted. Also, as illustrated in FIG. 6E, light shading members 77 containing a shading material may be shaped into line shapes extending in a single direction.

Figure 6F:
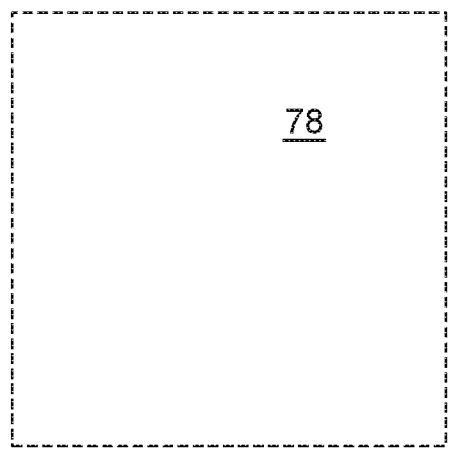

Also, as illustrated in FIG. 6F, the first region B2 and the second region D2 may also be provided with a halftone material 78 on one surface of the glass substrate 62. The halftone material 78 is a semi-transparent film (e.g., a translucent film), and for example, a material containing molybdenum (Mo), chrome (Cr), silicon (Si), and nitrides (N) or the like can be used. Light passing through the halftone material 78 is reduced. The light transmittance of the halftone material 78 can be controlled by adjusting properties such as the composition ratio of the materials contained in the halftone material 78 or the thickness of the halftone material 78. In this case, the first transmissive structure 64 and the second transmissive structure 66 formed by the halftone material 78 act as a masking portion that masks the first region B2 and the second region D2.

Figure 7:
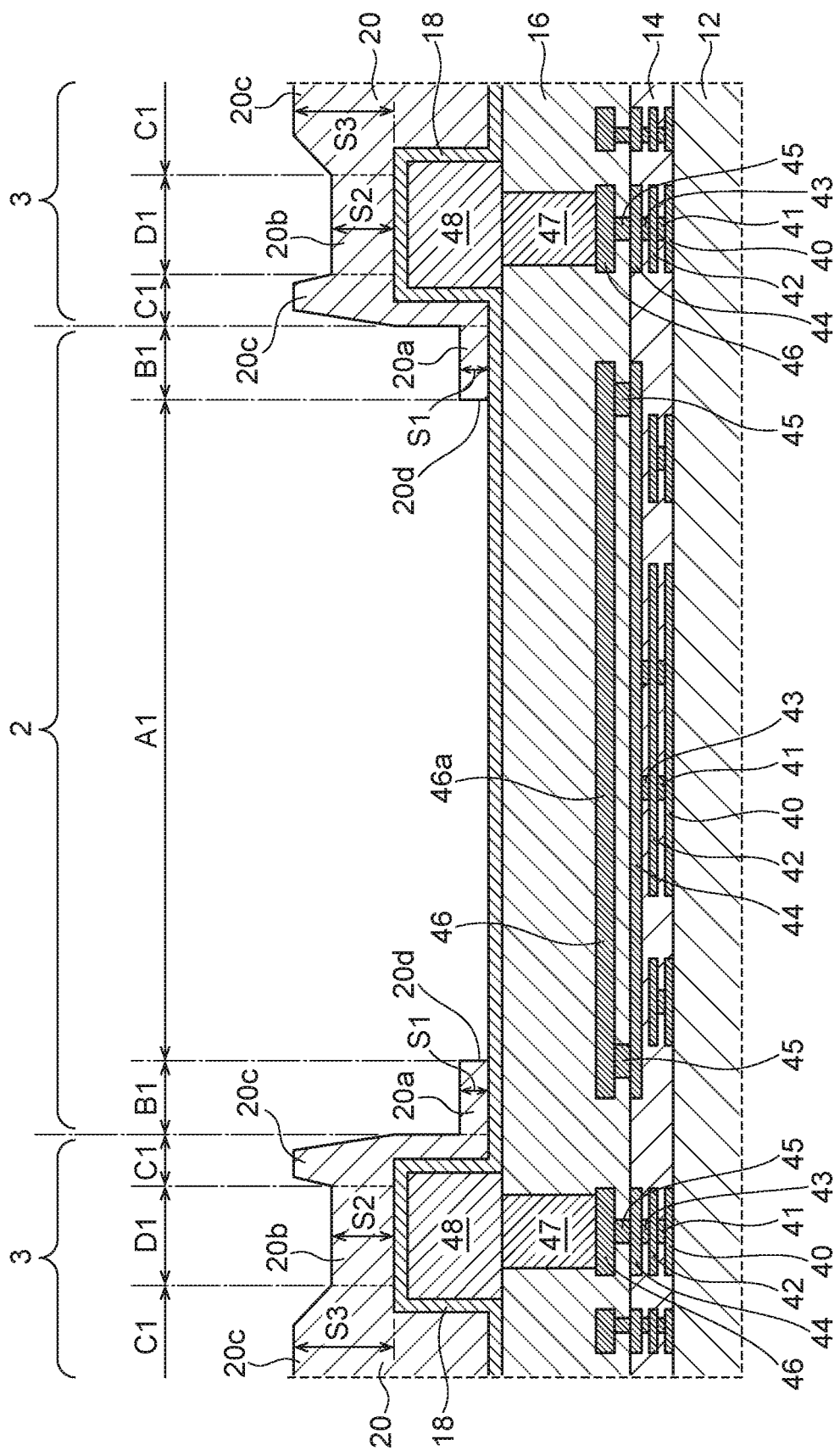
FIG. 7 is a diagram illustrating the semiconductor device and the method of manufacturing the same according to the first embodiment, and is a longitudinal section illustrating one example of the schematic configuration in an exemplary process stage following FIG. 5.

The photomask 60 disposed as described above is used to perform an exposure process with respect to the polyimide film 20 on the semiconductor substrate 12, and thereafter the development process is performed. After that, the polyimide film 20 is heated to a curing temperature and an annealing process is performed to cure the polyimide film 20. Through the above steps, the polyimide film 20 provided with the polyimide parts 20a, 20b, and 20c is formed, as illustrated in FIG. 7.

The third region C1 on the semiconductor substrate 12 corresponding to the third region C2 of the photomask 60 provided with the light shading part 68 is not irradiated with light. For this reason, in the third region C1, the polyimide part 20c of the polyimide film 20 remains. In this case, in the region corresponding to the third region. C2, the thickness of the polyimide film 20 is not decreased.

In the exposure step, an exposure dose sufficient to completely remove the polyimide film 20 in the fourth region A1 on the semiconductor substrate 12 corresponding to the fourth region A2 is set. In the fourth region A1, the polyimide film 20 is removed after development. In the first region B1 and the second region D1 on the semiconductor substrate 12 corresponding to the first region B2 and the second region D2, the exposure dose is greater than the exposure dose in the third region C1 and less than the exposure dose in the fourth region A1. For this reason, in the first region B1 and the second region D1, because the polyimide film 20 is partially exposed, the thickness of the polyimide film 20 is decreased after development.

Also, the light transmittance in the first region B2 is higher than the light transmittance in the second region D2. For this reason, the exposure dose in the first region B1 is greater than the exposure dose in the second region D1. Consequently, the thickness of the polyimide part 20a in the first region B1 is smaller than the thickness of the polyimide part 20b in the second region D1. Through the above steps, the configuration illustrated in FIG. 7 is formed.

Next, the polyimide film 20 patterned as above is used as an etching mask to perform anisotropic dry etching on the second insulating film 18 and the first insulating film 16. Because the opening 20d where no polyimide film 20 exists is disposed in the fourth region A1, both the second insulating film 18 and the first insulating film 16 start to be etched from the beginning of the etching step.

By the etching, in the fourth region A1, the second insulating film 18 and the first insulating film 16 on the metal pads 46a are removed, and the opening 8 is formed as illustrated in FIG. 3. With this arrangement, the top face 46b of the metal pads 46a is exposed.

Also, as illustrated in FIG. 7, in the first region B1 and the second region D1, the polyimide part 20a with the thickness S1 and the polyimide part 20b with the thickness S2 are formed. The dry etching also causes the polyimide film 20 to be etched. However, the etch rate of the polyimide film 20 is lower than that of the second insulating film 18 and the first insulating film 16.

In the first region B1 and the second region D1, the polyimide parts 20a and 20b with reduced thickness disappear partway through the etching process, and thereafter, the etching of the lower layers is started. The thickness of the polyimide film 20 is set with consideration for the selectivity ratio between the polyimide film 20 and the first and second insulating films 16 and 18 during etching, or in other words, the selectivity ratio between the polyimide film 20, the silicon nitride film, and the silicon oxide film.

In the first region B1, the start of the etching of the second insulating film 18 and the first insulating film 16 is delayed by the amount of time that the polyimide part 20a still remains. The thinner the polyimide film 20, the sooner etching is started, and therefore the etching amount in the layer underneath increases. When etching ends, the insulating film 6 with the thickness T1 remains, as illustrated in FIG. 3.

In the second region D1, the start of the etching of the second insulating film 18 is delayed by the amount of time that the polyimide part 20b with the thickness S2 still remains. When etching ends, the second insulating film 18 on the uppermost interconnect 48 is removed and the opening 48a is formed, as illustrated in FIG. 3. In the opening 48a, the top face of the uppermost interconnect 48 is exposed.

In the first region B1, the second insulating film 18 and a portion of the first insulating film 16 are etched. In contrast, in the second region D1, it is sufficient to etch just the second insulating film 18. For this reason, the etching amount in the second region D1 may be less than the etching amount in the first region B1. Consequently, in the embodiment, by making the thickness S2 of the polyimide part 20b in the second region D1 larger than the thickness S1 of the polyimide part 20a in the first region B1, the timing at which etching starts is delayed, and the etching amount after the removal of the polyimide part 20b is reduced.

Also, by delaying the timing at which etching starts in the second region D1, the length of time during which the uppermost interconnect 48 is exposed to the plasma environment of the dry etching can be shortened. With this arrangement, the influence of the antenna effect can be reduced. As above, by controlling the thickness of the polyimide film 20, the start timing of the etching target below the polyimide film 20 as well as the etching time can be controlled.

By performing the above steps, the semiconductor device 1A illustrated in FIG. 3 is manufactured.

According to the semiconductor device 1A, the method for forming the same, and the photomask 60 according to the first embodiment, the following effects are exhibited.

According to the semiconductor device 1A according to the embodiment, the metal pads 46a in the scribe portion 2 are included in the uppermost layer of the intermediate wiring layer 38 that contains a plurality of wiring layers. The intermediate wiring layer 38 is a wiring layer positioned below the uppermost interconnect 48 used in the redistribution layer 48b. The uppermost interconnect 48 is thick, but the fourth metal wiring layer 46 is thin in comparison. With this arrangement, the thick uppermost interconnect 48 does not exist in the cut portion 9 of the scribe portion 2, thereby suppressing the occurrence of cracks in the dicing step.

Also, the insulating film 6 in the scribe portion 2 is thin compared to the first insulating film 16 in the main circuit portions 3. With this arrangement, the occurrence of cracks in the dicing step is suppressed.

As above, in the semiconductor device 1A according to the embodiment, the occurrence of cracks in the dicing step is suppressed, and therefore the yield can be improved.

According to the method of forming the semiconductor device 1A and the photomask 60 according to the embodiment, the opening 20d where the polyimide film 20 is not formed, the polyimide part 20a having the thickness S1, the polyimide part 20b having the thickness S2, and the polyimide part 20c having the thickness S3 are formed on the semiconductor substrate 12.

The thickness S1, the thickness S2, and the thickness S3 exist in the relationship "thickness S1<thickness S2<thickness S3". In the first embodiment, the opening 20d and the polyimide film 20 having the three thicknesses S1, S2, and S3 can be formed in a single photolithography step. The opening 20d is formed in the fourth region A1 on the semiconductor substrate 12. The polyimide part 20a with the thickness S1 is formed in the first region B1. The polyimide part 20b with the thickness S2 is formed in the second region D1. The polyimide part 20c with the thickness S3 is formed in the third region C1.

The photomask 60 used in the step of exposing the polyimide film 20 is provided with the glass substrate 62, the first transmissive structure 64, the second transmissive structure 66, and the light shading part 68. One surface of the photomask 60 is divided into the fourth region A2 where the first transmissive structure 64, the second transmissive structure 66, and the light shading part 68 are not disposed, the first region B2 where the first transmissive structure 64 is disposed, the third region C2 where the light shading part 68 is disposed, and the second region D2 where the second transmissive structure 66 is disposed.

The fourth region A1 corresponds to the fourth region A2. The first region B1 corresponds to the first region B2. The third region C1 corresponds to the third region C2. The second region D1 corresponds to the second region D2. The light provided in the exposure step irradiates the fourth region A1 on the semiconductor substrate 12 without being substantially reduced by the fourth region A2. The light provided in the exposure step is shaded by the third region C2, and substantially does not irradiate the third region C1 on the semiconductor substrate 12.

When the light provided in the exposure step passes through the first region B2 having a first transmittance and the second region D2 having a second transmittance, the light is reduced according to each transmittance and irradiates the semiconductor substrate 12. Because the first transmittance of the first region B2 is higher than the second transmittance of the second region D2, the thickness S1 of the polyimide part 20a in the first region B1 on the semiconductor substrate 12 corresponding to the first region B2 is smaller than the thickness S2 of the polyimide part 20b in the second region D1 corresponding to the second region D2.

In this way, with the method of forming the semiconductor device 1A and the photomask 60 according to the first embodiment, the polyimide parts 20a, 20b, and 20c having respectively different thicknesses and the opening 20d can be formed in a single lithography step. Consequently, the semiconductor device 1A can be manufactured at lower cost. Also, with this arrangement, the semiconductor device 1A having the first insulating film 16 and the insulating film 6 with different thicknesses can be provided by a single lithography step and etching step. Because the number of steps is reduced, it, is possible to provide the semiconductor device 1A at lower cost.

Second Embodiment

Next, a second embodiment will be described with reference to FIGS. 8 to 13. In the description of the second embodiment, portions of the configuration shared in common with the first embodiment will be denoted with the same or similar signs or will be referred to by the same or similar names, and further description will be omitted.

Figure 8:
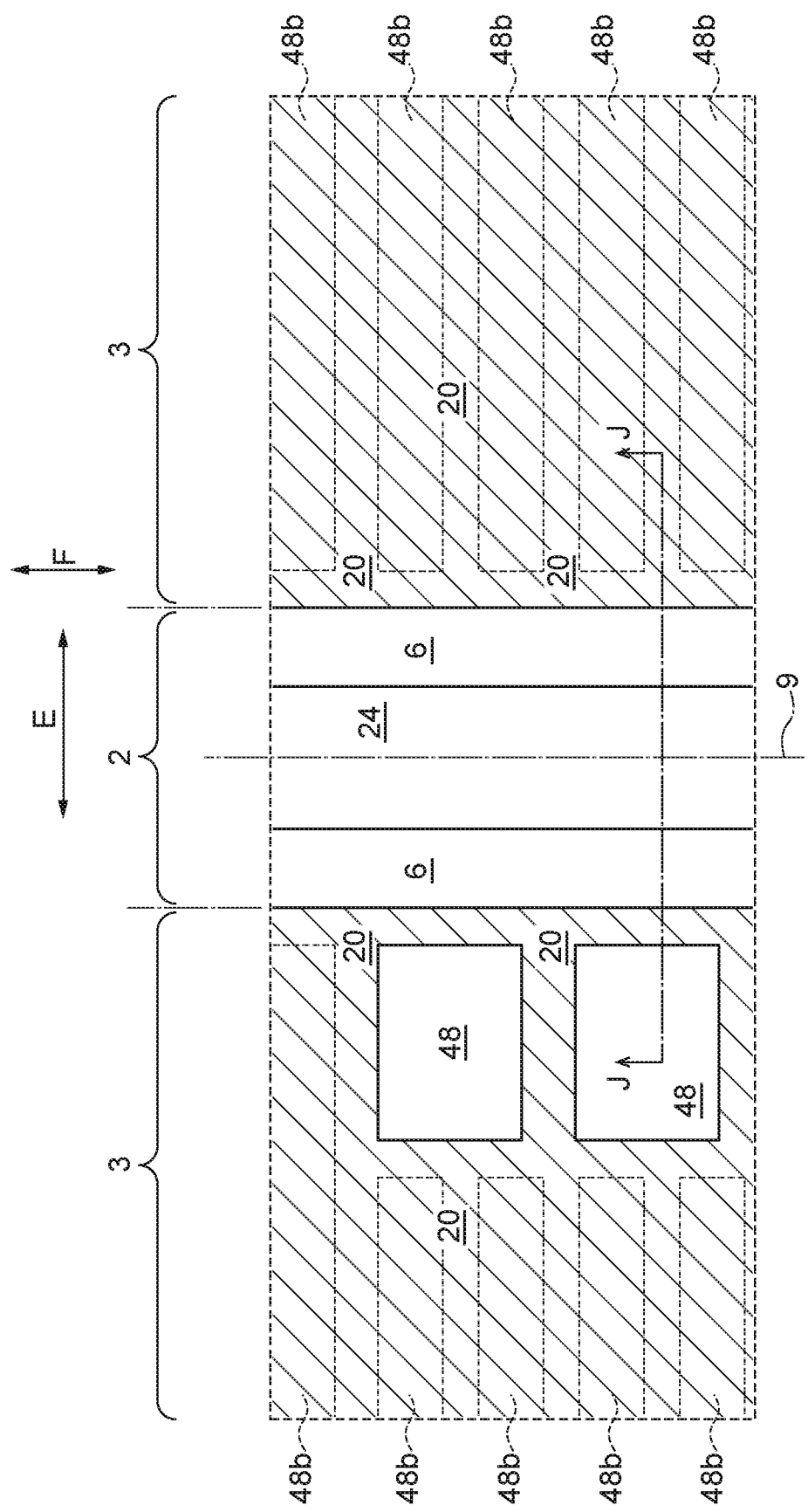
FIG. 8 is a plan view illustrating a schematic configuration of a part of the semiconductor device according to the second embodiment.
Figure 9:
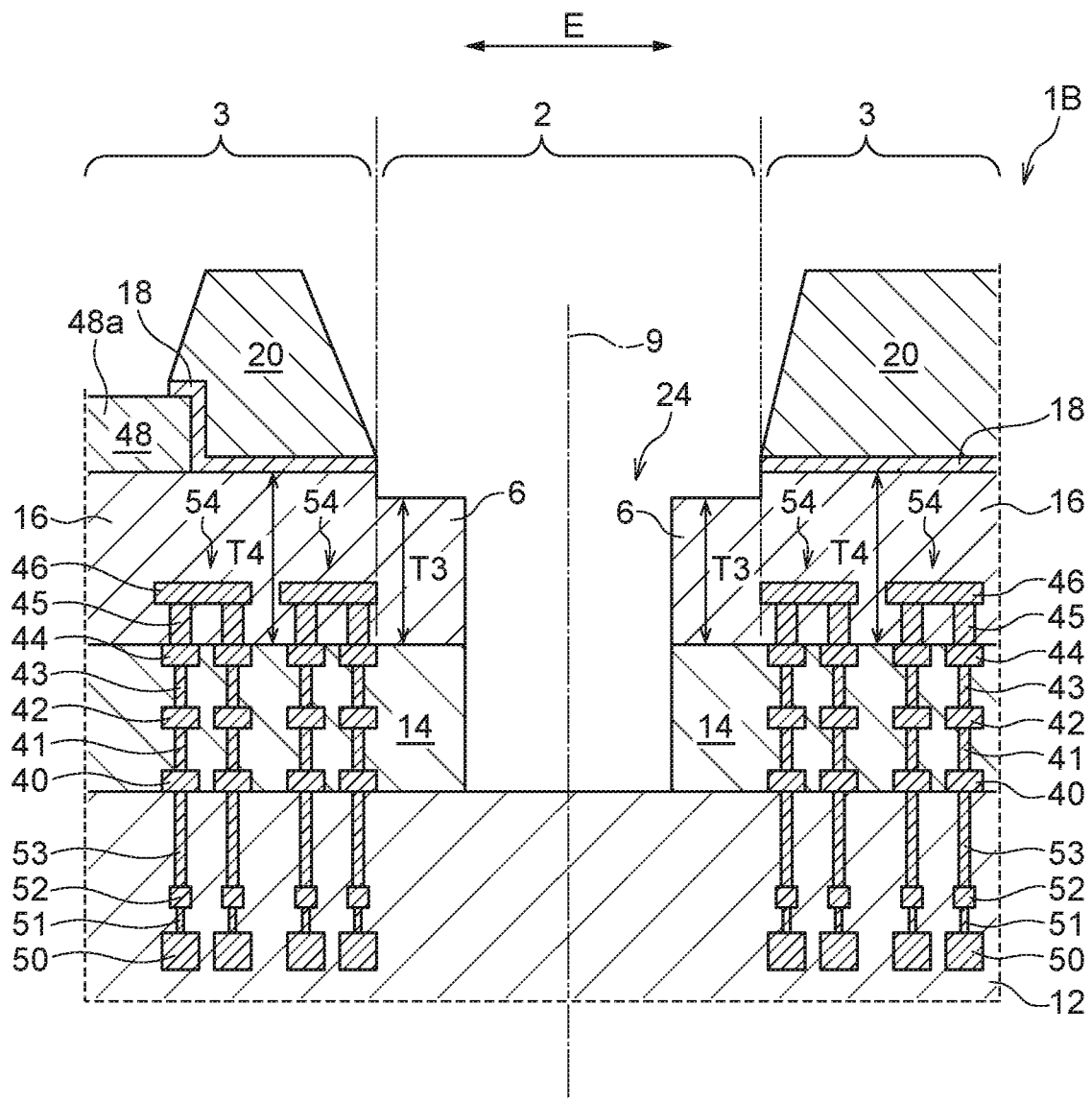
FIG. 9 is a diagram illustrating the semiconductor device and the method of manufacturing the same according to the second embodiment, and is a longitudinal section illustrating one example of the schematic configuration in a final process stage.

FIGS. and 9 are diagrams illustrating a schematic configuration of a semiconductor device 1B according to the second embodiment. FIG. 8 is an enlarged view of the region P in FIG. 1. FIG. 8 is a plan view illustrating one example of a schematic configuration of the scribe portion 2 and the main circuit portions adjacent to the scribe portion 2 exemplified in the second embodiment. In FIGS. 8 and 9, the cut portion 9 is illustrated in a central part of the scribe portion 2. The cut portion 9 is formed in a later dicing step. The cut portion 9 is formed in the approximate center in the width direction E of the scribe portion 2. FIG. 9 illustrates a schematic longitudinal section of the portion along the line J-J in FIG. 8.

As illustrated in FIGS. 8 and 9, a groove 24 provided with a predetermined width and depth is disposed centrally in the width direction of the scribe portion 2. The groove 24 extends in the direction F. In the scribe portion 2, the insulating film 6 is disposed on either side of the groove 24 in the width direction E.

As illustrated in FIG. 9, in the scribe portion 2, the low-k film 14 is disposed on the semiconductor substrate 12, and the insulating film 6 is disposed on the low-k film 14. The insulating film. 6 has a thickness T3. In the central part of the scribe portion 2, the groove 24 reaching to the bottom of the low-k film 14 is disposed. The groove 24 penetrates at least from the top face to the bottom face of the low-k film 14. The groove 24 divides the low-k film 14 in the width direction E.

As illustrated in FIG. 9, in the main circuit portions 3, a stacked structure 54 is disposed along the boundary lines between the scribe portion 2 and the main circuit portions 3. The stacked structure 54 includes a lower first wiring layer 50, a lower first connecting portion 51, a lower second wiring layer 52, a lower second connecting portion 53, the first metal wiring layer 40, the first connecting portion 41, the second metal wiring layer 42, the second connecting portion 43, the third metal wiring layer 44, the third connecting portion 45, and the fourth metal wiring layer 46.

As illustrated in FIG. 9, the stacked structure 54 is disposed two columns at a time. The opposing and lateral faces of the first metal wiring layer 40 to the third metal wiring layer 44 are covered by the low-k film 14. The stacked structure 54 penetrates through the low-k film 14, and portions of the stacked structure 54 are disposed inside the first insulating film 16 and also inside the semiconductor substrate 12. Each component of the stacked structure 54, the low-k film 14, the first insulating film are formed using photolithography technology, etching technology, and CVD. Note that although the second embodiment illustrates an example of disposing the stacked structure 54 in two columns, this configuration is an illustration, and the stacked structure 54 may also be disposed as a single column, or as a plurality of three or more columns.

In the main circuit portions 3, the uppermost interconnect is disposed on the first insulating film 16. The second insulating film 18 and the polyimide film 20 are disposed to cover the first insulating film 16 and the uppermost interconnect 48. The top face of the uppermost interconnect 48 is the opening 48a where the second insulating film 18 and the polyimide film 20 have been removed. In the opening 48a, the top face of the uppermost interconnect 48 is exposed.

The first insulating film 16 of the main circuit portions 3 has a thickness T4. A step is formed between the insulating film 6 having the thickness T3 and the first insulating film 16 having the thickness T4. The thickness T3 of the insulating film 6 in the scribe portion 2 and the thickness T4 of the first insulating film 16 in the main circuit portions 3 exist in the following relationship.

Thickness T3<Thickness T4

Next, FIGS. 8 to 13 will be referenced to describe a method of forming the semiconductor device 1B and a photomask 61 according to the second embodiment.

Figure 10:
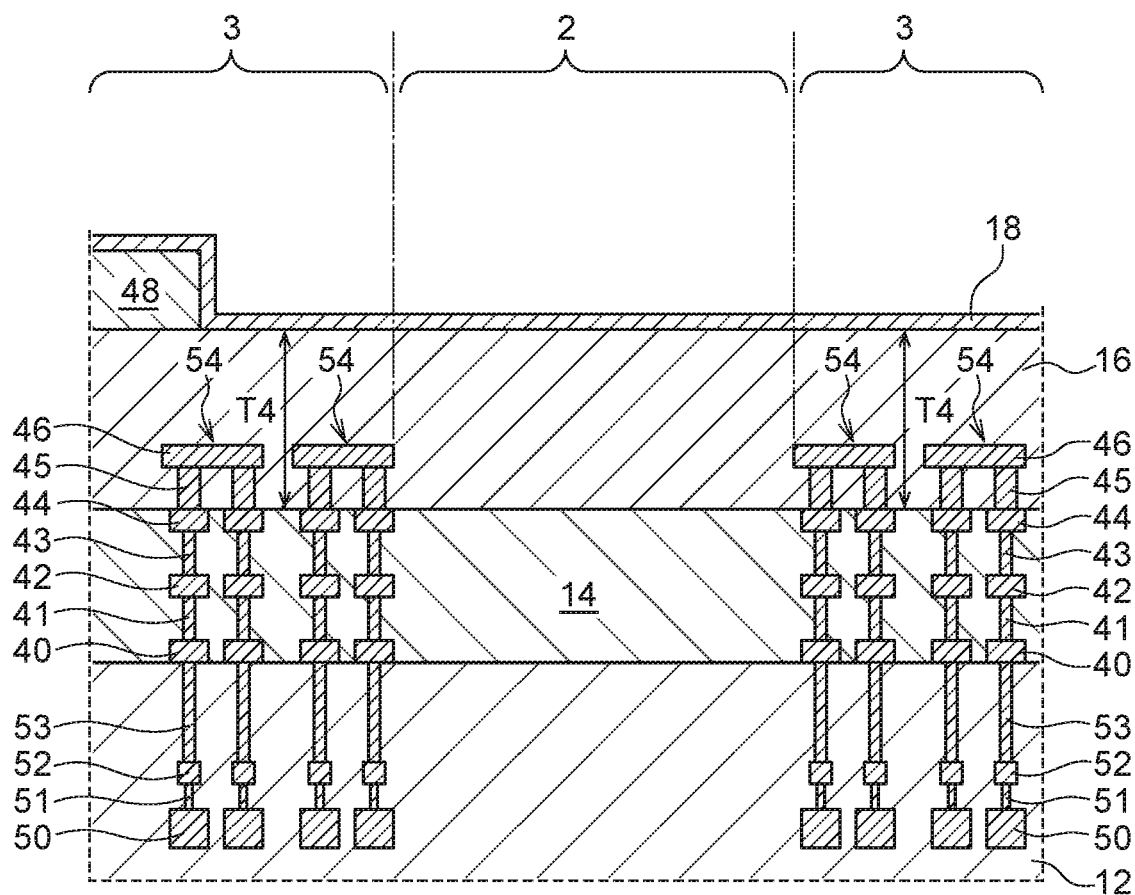
FIG. 10 is a diagram illustrating the semiconductor device and the method of manufacturing the same according to the second embodiment, and is a longitudinal section illustrating one example of the schematic configuration in an exemplary process stage.

First, as illustrated in FIG. 10, in the main circuit portions 3, the semiconductor substrate 12 in which the lower first wiring layer 50, the lower first connecting portion 51, the lower second wiring layer 52, and the lower second connecting portion 53 are formed is prepared. These layers are formed by stacking insulating layers in the semiconductor substrate 12 while successively forming the lower first wiring layer 50, the lower first connecting portion 51, the lower second wiring layer 52, and the lower second connecting portion 53, for example.

Next, the low-k film 14 provided with the first metal wiring layer 40, the first connecting portion 41, the second metal wiring layer 42, the second connecting portion 43, and the third metal wiring layer 44 is formed. These layers are formed by forming a plurality of low-k films while successively forming the first metal wiring layer 40, the first connecting portion 41, the second metal wiring layer 42, the second connecting portion 43, and the third metal wiring layer 44, for example.

Next, the third connecting portion 45 and the fourth metal wiring layer 46 are formed, and the first insulating film 16 is formed. These layers are formed by forming the first insulating film 16 while successively forming the third connecting portion 45 and the fourth metal wiring layer 46.

Through the above steps, the stacked structure 54 buried inside the semiconductor substrate 12, the low-k film 14, and the first insulating film 16 is formed. Laser grooving is used in the dicing region prior to dicing. At this time, the stacked structure 54 is disposed to protect the main circuit regions 3 from heat and shock. Furthermore, in the case where cracks occur during dicing, a function of suppressing the propagation of such cracks into the main circuit regions 3 is also provided.

Next, the uppermost interconnect 48 is formed on the first insulating film 16. The uppermost interconnect 48 contains aluminum (Al), for example. Thereafter, as illustrated in FIG. 10, the second insulating film 18 is deposited on the first insulating film 16 and also on the uppermost interconnect 48. The second insulating film 18 contains a silicon nitride (SiN) film, for example.

Next, the polyimide film 20 is applied on top of the second insulating film 18. The polyimide film 20 contains a positive photosensitive resin, for example. The polyimide film 20 is applied as follows. A polyimide liquid is dripped onto the semiconductor substrate 12 and spin-coated. Next, a soft-bake is performed to evaporate unwanted solvent component.

Figure 11:
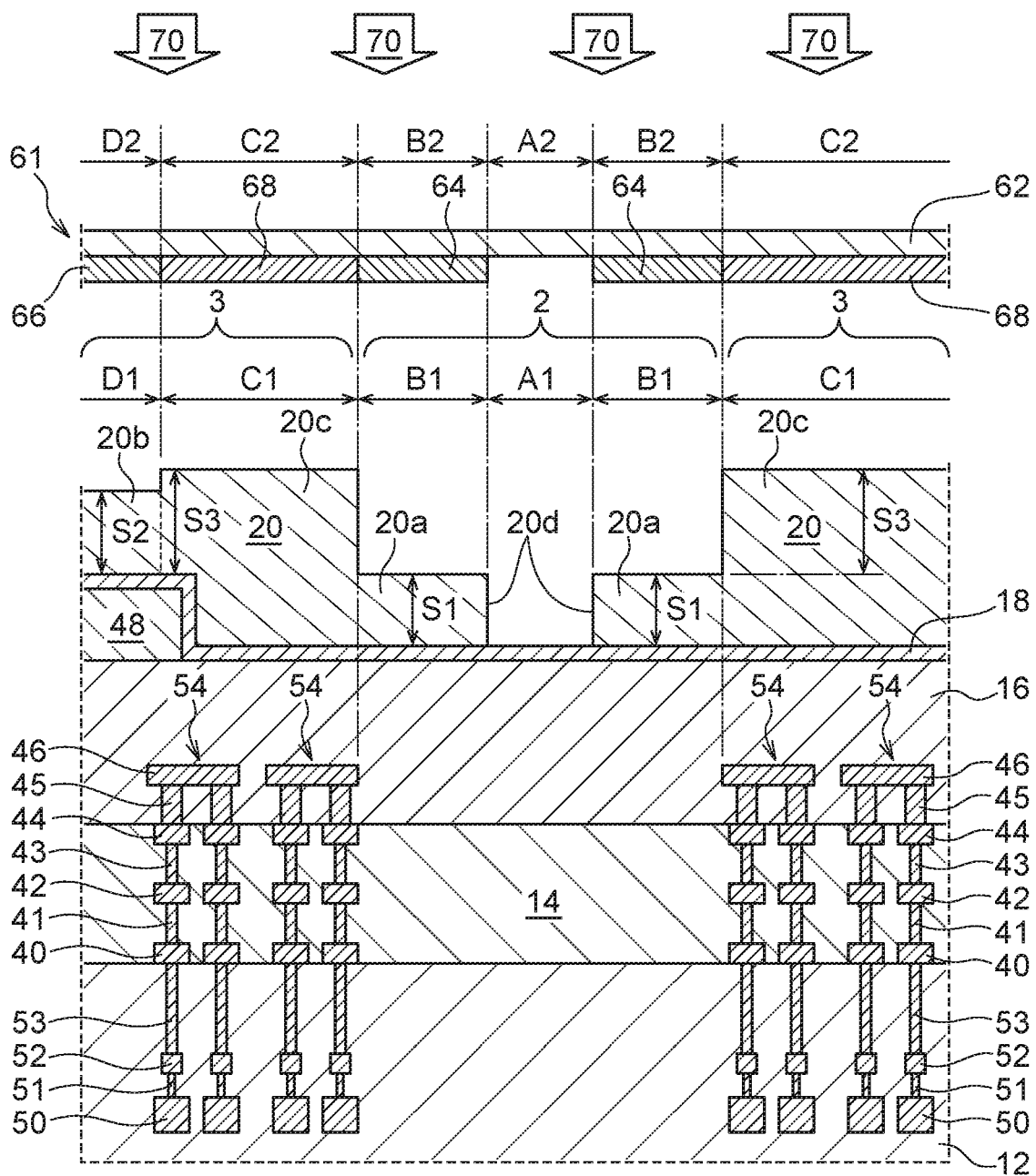
FIG. 11 is a diagram illustrating the semiconductor device and the method of manufacturing the same according to the second embodiment, is a longitudinal section illustrating one example of the schematic configuration in an exemplary process stage following FIG. 10, and is a longitudinal section illustrating a schematic configuration of a photomask according to an embodiment disposed in correspondence with the semiconductor device.
Figure 12:
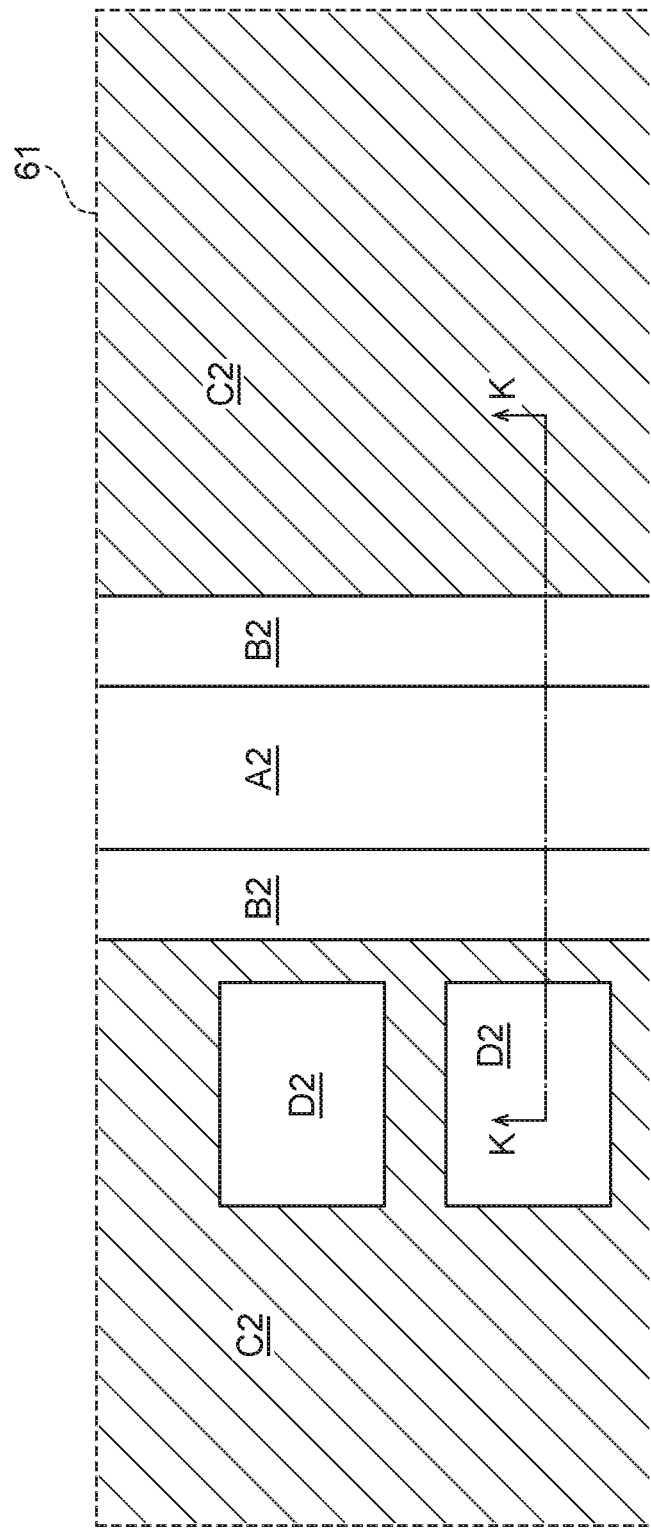
FIG. 12 is a plan layout view illustrating a schematic configuration of a part of the photomask according to the second embodiment.

Next, as illustrated in FIGS. 11 and 12, the polyimide film 20 is patterned by performing exposure and development processes. Although the layout of the photomask 61 used in the exposure step is different, the rest of the configuration is similar to the method performed in the first embodiment. In the second embodiment, the pattern the photomask 61 is likewise laid out in correspondence with the regions on the semiconductor substrate 12.

As illustrated in FIGS. 11 and 12, the fourth region A2 corresponds to the fourth region A1 on the semiconductor substrate 12. The first region B2 corresponds to the first region B1 on the semiconductor substrate 12. The third region C2 corresponds to the third region C1 on the semiconductor substrate 12. The second region D2 corresponds to the second region D1 on the semiconductor substrate 12.

The photomask 61 is provided with the glass substrate 62, and the first transmissive structure 64, the second transmissive structure 66, and the light shading part 68 provided on the surface of the glass substrate 62. None of the first transmissive structure 64, the second transmissive structure 66, and the light shading part 68 is disposed in the fourth region A2 of the photomask 61. The light shading part 68 is provided in the third region C2 of the photomask 61.

The first transmissive structure 64 is provided in the first region B2 of the photomask 61. The second transmissive structure 66 is provided in the second region D2 of the photomask 61. The respective transmittances of the fourth region A2, the first region B2, the third region C2, and the second region D2 exist in the following relationship.

Transmittance of A2>Transmittance of B2>Transmittance of D2>Transmittance of C2

Also, after the exposure and development processes, the thicknesses S1, S2, and S3 of the polyimide parts 20a, 20b, and 20c in the first region B1, the third region C1, and the second region D1 on the semiconductor substrate 12 exist in the following relationship.

Thickness S1<Thickness S2<Thickness S3

As for the method of adjusting the transmittances of the first transmissive structure 64 in the first region B2 and the second transmissive structure 66 in the second region D2, the methods described with reference to FIGS. 6A to 6F in the first embodiment can be used.

Figure 13:
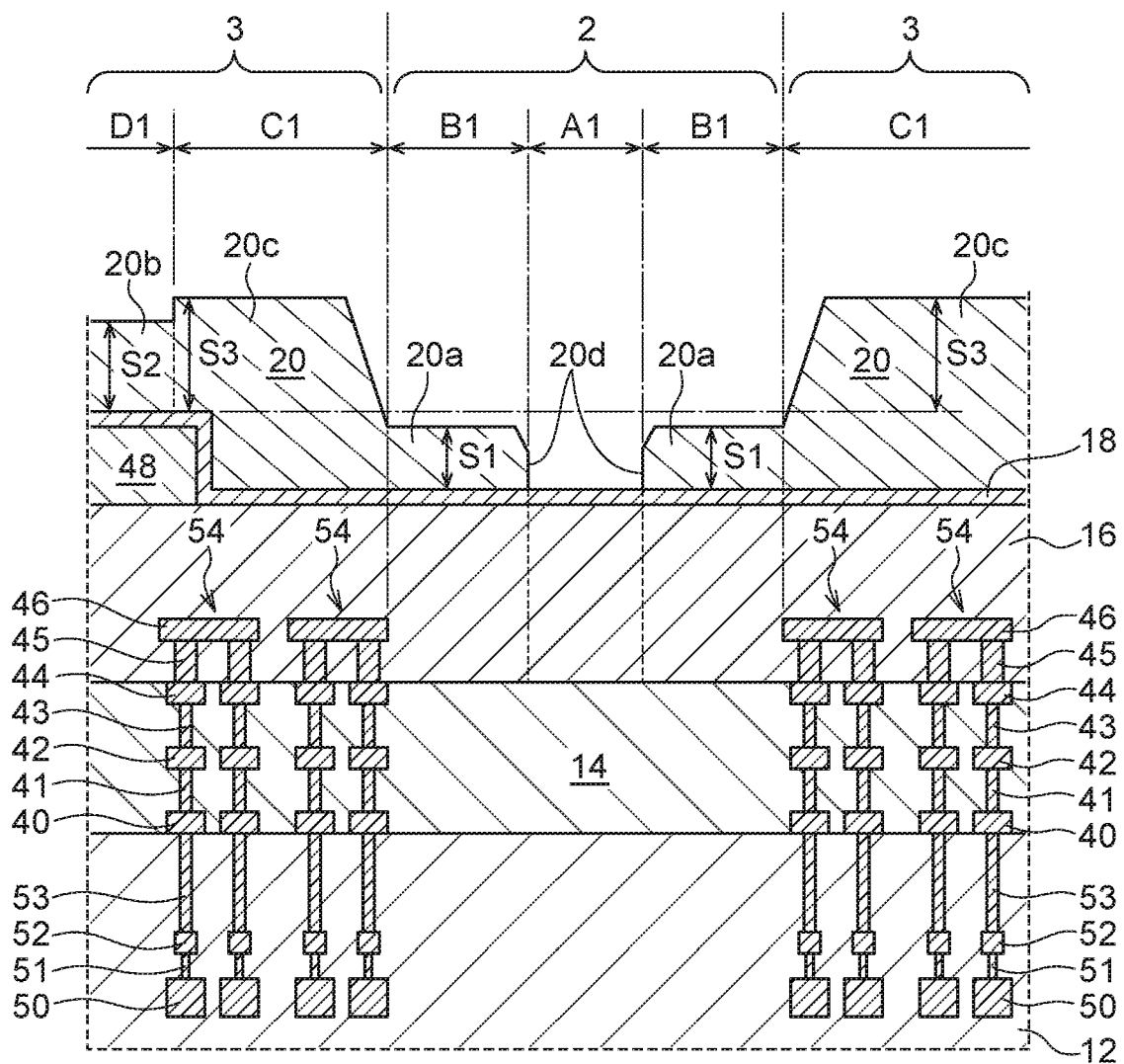
FIG. 13 is a diagram illustrating the semiconductor device and the method of manufacturing the same according to the second embodiment, and is a longitudinal section illustrating one example of the schematic configuration in an exemplary process stage following FIG. 11.

Next, as illustrated in FIG. 13, a furnace or oven is used to anneal the patterned polyimide film. 20, causing the polyimide film 20 to change and have predetermined polyimide film properties. Through the annealing, the shoulder portions of the polyimide film 20 change to a somewhat diagonal shape. With this arrangement, the polyimide film 20 provided with the opening 20d, the polyimide part 20a with the thickness S1, the polyimide part 20b with the thickness S2, and the polyimide part 20c with the thickness S3 is formed. Note that each of the thickness S2 and the thickness S3 is the thickness from top from of the second insulating film 18 on the uppermost interconnect 48, similarly to the first embodiment.

Next, the polyimide film 20 patterned as above is used as an etching mask to perform anisotropic dry etching on the second insulating film 18, the first insulating film 16, and the low-k film 14, as illustrated in FIG. 9. In the opening 20d, the second insulating film 18, the first insulating film 16, and the low-k film 14 are successively etched away, and the groove 24 reaching to at least the bottom of the low-k film 14 is formed. The groove 24 penetrates at least from the top face to the bottom face of the low-k film 14.

Also, during the etching, the width of the opening 20d in the polyimide film 20 widens, and the groove 24 having a width greater than the opening 20d is formed. In the portion where the polyimide part 20a with the thickness S1 had been disposed, the polyimide part 20a disappears partway through the etching, and after that, the second insulating film 18 and the first insulating film 16 are etched. With this arrangement, the insulating film 6 whose the top face exists below the bottom face of the second insulating film 18 is formed. The insulating film 6 has the thickness T3.

Note that the thickness T3 is the thickness of the insulating film 6 from the top face of the low-k film 14. In the portion where the polyimide part 20b with the thickness S2 had been disposed, or in other words, in the portion above the uppermost interconnect 48, the polyimide part 20b disappears partway through the etching, and after that, the second insulating film 18 is etched.

The second insulating film 18 is etched away, leaving the top face of the uppermost interconnect 48 exposed. After the top face of the uppermost interconnect 48 is exposed, the etching stops without substantially proceeding farther. The etching target on the uppermost interconnect 48 is the thin second insulating film 18. The thickness S2 of the polyimide part 20b is greater than the thickness S1 of the polyimide part 20a. For this reason, the start timing of the etching with respect to the second insulating film 18 on the uppermost interconnect 48 is delayed, and the top of the uppermost interconnect 48 is not overly exposed to the etching environment.

The portion where the polyimide part 20c with the thickness S3 had been disposed is set to be thick enough not to disappear due to the etching. For this reason, in this portion, the polyimide film 20 does not disappear until the etching ends. Consequently, the second insulating film 18 and the first insulating film 16 underneath the polyimide film 20 remain in their original state. The first insulating film 16 underneath the polyimide film 20 has the thickness T4.

By performing the above steps, the semiconductor device 1B illustrated in FIG. 9 is manufactured.

According to the semiconductor device 1B, the method of forming the same, and the photomask 61 according to the second embodiment, effects similar to the semiconductor device 1A, the method of forming the same, and the photomask 60 according to the first embodiment are exhibited. Furthermore, according to the semiconductor device 1B according to the second embodiment, the stacked structure 54 is formed in the main circuit portions 3 along the boundary lines between the scribe portion 2 and the main circuit portions 3. The stacked structure 54 functions as a stopper that suppresses the propagation of cracks occurring during dicing into the main circuit portions 3. Consequently, the propagation of cracks occurring during dicing into the main circuit portions 3 can be suppressed.

Also, according to the semiconductor device 1B according to the second embodiment, the groove 24 penetrates through the low-k film 14. The low-k film 14 does not exist in the cut portion 9. Consequently, the occurrence of cracks in the dicing step is suppressed. For this reason, cracks are suppressed from propagating through the low-k film 14 and reaching the main circuit portions 3.

In the embodiments described above, a case of using a positive polyimide film is given as an example, but a negative polyimide film can be used instead. In the case of using a negative polyimide film, the light and dark patterns of the photomasks 60 and 61 used as the exposure masks are inverted.

As above, DRAM is described as an example of the semiconductor device according to various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device. Furthermore, devices other than memory, including logic ICs such as a microprocessor and an application-specific integrated circuit (ASIC) for example are also applicable as the semiconductor device according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A method comprising:
   forming an insulating film over first, second, third and fourth regions of a semiconductor substrate;
   forming a polyimide film on the insulating film; and
   patterning the polyimide film with a lithography method using a photomask including at least a first region of a first transmittance rate, a second region of a second transmittance rate, a third region having a shading material, and a fourth region, wherein the first, second, third and fourth regions of the photomask correspond to the first, second, third and fourth regions of the semiconductor substrate, respectively.

2. The method of claim 1,
   wherein the fourth region of the semiconductor substrate has no polyimide film.

3. The method of claim 1,
   wherein the thickness of the polyimide film of the first region of the semiconductor substrate is smaller than the thickness of the polyimide film of the second region of the semiconductor substrate.

4. The method of claim 1,
   wherein the thickness of the polyimide film of the second region is smaller than the thickness of the polyimide film of the third region.

5. The method of claim 1,
   wherein the polyimide film includes a positive type photosensitive material.

6. The method of claim 1,
   wherein, in the photomask, the first transmittance rate of the first region is larger than the second transmittance rate of the second region.

7. The method of claim 1,
   wherein, in the photomask, the second transmittance rate of the second region is larger than the third transmittance rate of the third region.

8. The method of claim 1,
   wherein, in the photomask, the fourth region is exposed.

9. The method of claim 1, further comprising etching the insulating film using the polyimide film as an etching mask.

10. The method of claim 9, wherein the thickness of the polyimide film of the first region and second region of the semiconductor substrate are set so as to be removed during the etching.

11. The method of claim 1,
    wherein a main circuit portion and a scribe portion surrounding the main circuit portion are arranged over the semiconductor substrate;
    further comprising forming a low-k insulating film over the semiconductor substrate before forming the insulating film; and
    further comprising forming a groove penetrating at least through the low-k insulating film in the scribe region.

12. A method comprising:
    preparing a semiconductor substrate;
    forming a polyimide film over the semiconductor substrate; and
    patterning the polyimide film with a lithography method using a photomask having a plurality of portions each having a different transmittance, so that remaining multilevel thicknesses of the polyimide film correspond to the portions of the photomask.

13. The method of claim 12, further comprising etching using the polyimide film as an etching mask,
    wherein at least one of the multilevel thicknesses of the polyimide film is set so as to be removed during the etching.

* * * * *